(12) United States Patent
Nakae

(10) Patent No.: US 11,832,443 B2
(45) Date of Patent: Nov. 28, 2023

(54) APPARATUSES INCLUDING CONTACTS IN A PERIPHERAL REGION

(71) Applicant: Micron Technology, Inc., Boise, ID (US)

(72) Inventor: Yutaka Nakae, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 261 days.

(21) Appl. No.: 17/407,030

(22) Filed: Aug. 19, 2021

(65) Prior Publication Data
US 2023/0056343 A1    Feb. 23, 2023

(51) Int. Cl.
| H01L 23/52 | (2006.01) |
| H10B 12/00 | (2023.01) |
| H01L 23/522 | (2006.01) |
| H01L 21/768 | (2006.01) |
| H01L 23/528 | (2006.01) |

(52) U.S. Cl.
CPC ....... H10B 12/50 (2023.02); H01L 21/76816 (2013.01); H01L 23/5226 (2013.01); H01L 23/5286 (2013.01); H10B 12/02 (2023.02); H10B 12/31 (2023.02)

(58) Field of Classification Search
CPC ........ H10B 12/50; H10B 12/02; H10B 12/31; H01L 21/76816; H01L 23/5226; H01L 23/5286
See application file for complete search history.

(56) References Cited

U.S. PATENT DOCUMENTS

| 9,887,126 | B2 * | 2/2018 | Peng | H01L 21/76808 |
| 2002/0141220 | A1 * | 10/2002 | Keeth | H10B 12/50 |
| | | | | 257/E27.097 |
| 2007/0212866 | A1 * | 9/2007 | Inomata | H01L 21/76816 |
| | | | | 438/597 |
| 2014/0210087 | A1 * | 7/2014 | Kang | H01L 23/532 |
| | | | | 257/774 |
| 2021/0013395 | A1 * | 1/2021 | Kuo | H10N 50/10 |

* cited by examiner

*Primary Examiner* — Shouxiang Hu
(74) *Attorney, Agent, or Firm* — Dorsey & Whitney LLP

(57) ABSTRACT

Apparatuses and methods for manufacturing semiconductor memory devices are described. An example method includes: forming first interconnects; forming first dielectric layers above the first interconnects in a peripheral region; removing portions of the first dielectric layers to form first openings through the first dielectric layers in the peripheral region to expose the first interconnects at bottoms of the first openings; depositing first conductive material in the peripheral region to form first contact portions in the first openings; forming second dielectric layers on the first dielectric layers and the first contact portions in the peripheral region; removing second portions of the second dielectric layers to form second openings through the second dielectric layers to expose the first contact portions at bottoms of the second openings; depositing second conductive material to form a plurality of second contact portions in the corresponding first openings; and forming second interconnects on the second contact portions.

15 Claims, 8 Drawing Sheets

APPARATUSES INCLUDING CONTACTS IN A PERIPHERAL REGION

BACKGROUND

High data reliability, high speed of memory access, lower power consumption and reduced chip size are features that are demanded from semiconductor memory. To reduce chip size, a distance between signal lines has become shorter. A semiconductor device may also include contacts, (e.g., vias) in a peripheral region. The contacts may transmit signals between transistors on the substrate and signal lines in upper layers of the semiconductor device. To form contacts, opening are created by etching layers above the substrate. Recently, contacts have become taller because of the increased height of the semiconductor devices. The semiconductor devices often include several layers of conductive, semi-conductive, and dielectric materials to form the various circuits of the semiconductor device. Due to taller height of the multiple layers of conductive, semi-conductive, and dielectric materials, openings (e.g., openings for vias, contacts, etc.) have become deeper. Deeper openings present challenges in forming (e.g., etching) the openings. For example, deeper etching results in openings with a larger cross-section. As a result, adjacent contacts with a larger cross-section created in the openings tend to become a short circuit, which is undesirable.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
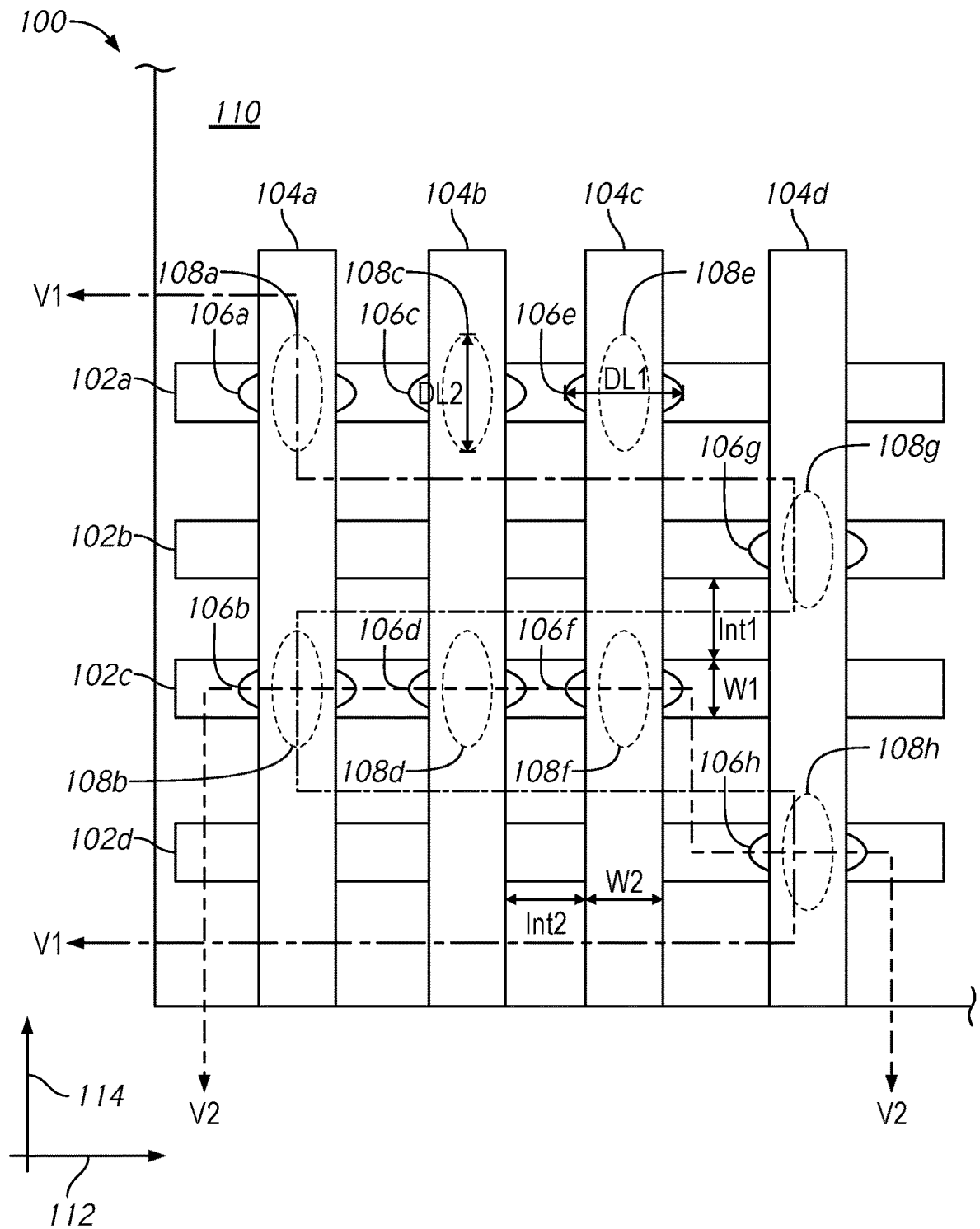
FIG. 1 is a diagram of a top view of a structure of a portion of a semiconductor device in accordance with an embodiment of the present disclosure.
Figure 2A:
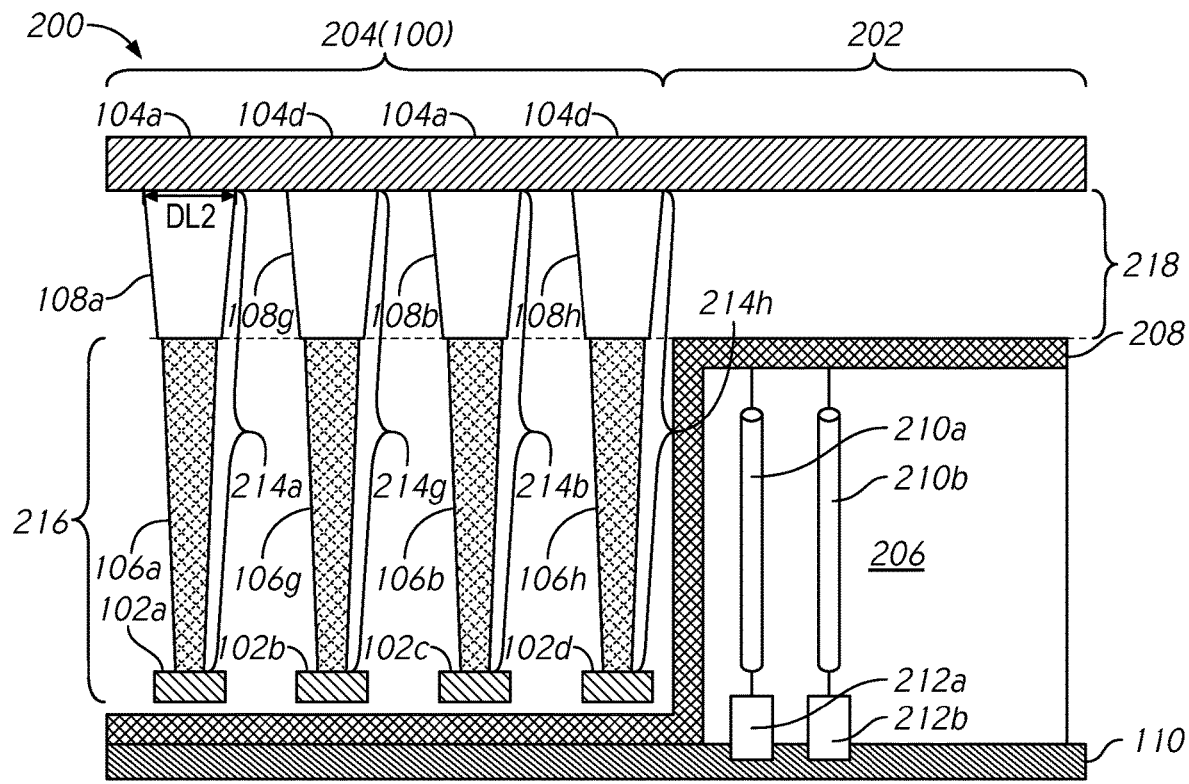
FIG. 2A is a diagram of a vertical cross-sectional view of a structure of another portion of the semiconductor device including the portion of the semiconductor device of FIG. 1 in accordance with an embodiment of the present disclosure.
Figure 2B:
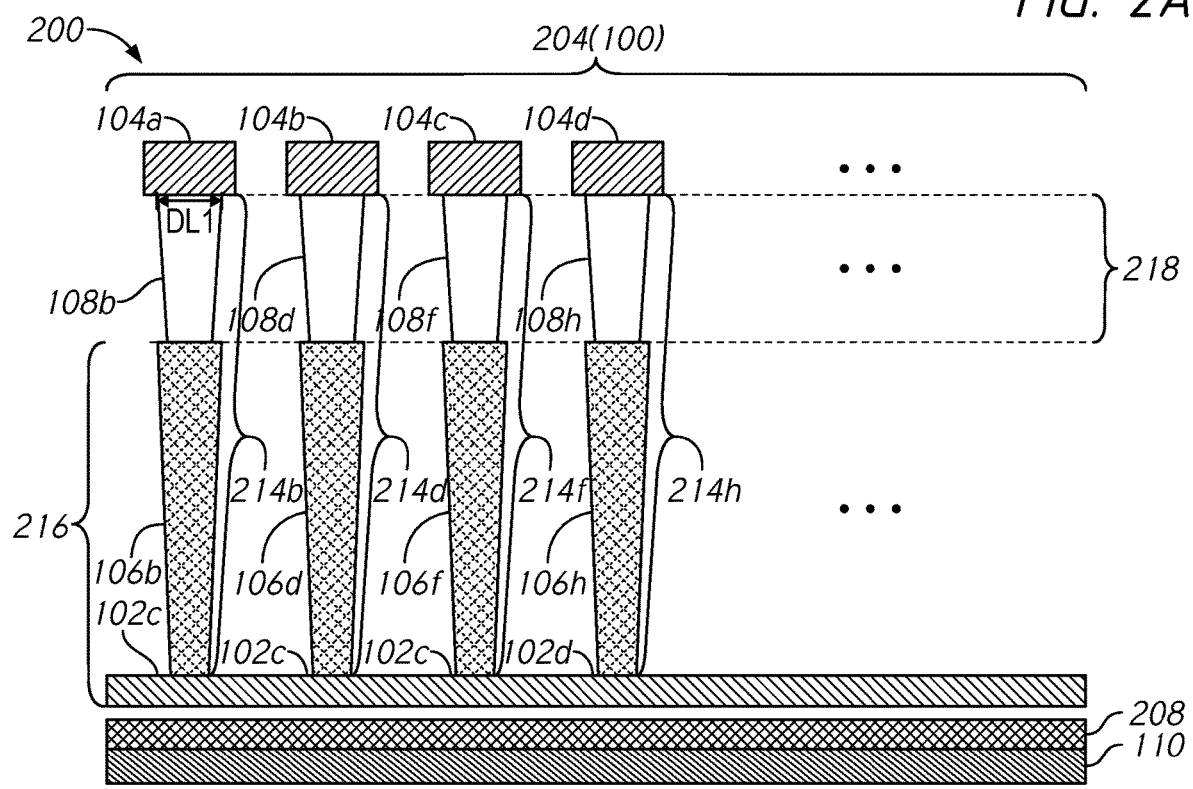
FIG. 2B is a diagram of another vertical cross-sectional view of the structure of the other portion of the semiconductor device of FIG. 2A in accordance with the embodiment of the present disclosure.

FIG. 1 is a diagram of a top view of a structure of a portion 100 of a semiconductor device 100 in accordance with an embodiment of the present disclosure. FIG. 2A is a diagram of a vertical cross-sectional view of a structure of another portion 200 including the portion 100 of a semiconductor device in accordance with an embodiment of the present disclosure. FIG. 2B is a diagram of another vertical cross-sectional view of the structure of the other portion 200 including the portion 100 of the semiconductor device in accordance with the embodiment of the present disclosure.

In some embodiments, the portion 100 of the semiconductor device in FIG. 1 may be included in a peripheral region 204 of the semiconductor device 200. The semiconductor device 100 may include a substrate 110. In the following description, the position "above" is oriented with the substrate 110 at a bottom of the semiconductor device 100. In some embodiments, the substrate 110 may extend in a plane that may include a direction 112 and another direction 114 different from the direction 112. In some embodiments, the direction 114 may be perpendicular to the direction 112. FIG. 1 may be viewed from above, that is a direction perpendicular to the directions 112 and 114. The vertical cross sectional view of the portion 200 in FIG. 2A is a view along the segments V1 in the direction 112. The other vertical cross sectional view of the portion 200 in FIG. 2B is a view along the segments V2 in the direction 114.

The semiconductor device 100 may include interconnects 102a-102d disposed above the substrate 110. In some embodiments, the interconnects 102a-102d may extend in parallel to one another in the direction 112. In some embodiments, the interconnects 102a-102d may include conductive material, such as copper or aluminum, for example. In some embodiments, the interconnects 102a-102d may be formed in a wiring layer (e.g., a metal1 layer). The semiconductor device 100 may include interconnects 104a-104d above the interconnect 102a-102d. In some embodiments, the interconnects 104a-104d may extend in parallel to one another in the direction 114, perpendicular to the direction 112. In some embodiments, the interconnects 104a-104d may include conductive material, such as copper or aluminum, for example. In some embodiments, the interconnects 104a-104d may be formed in another wiring layer (e.g., a metal2 layer).

The semiconductor device 100 may include contacts that couple interconnects 102a-102d to interconnects 104a-104d. Each of the contacts may include conductive portions that extend through various layers between the interconnects 102a-102d and interconnects 104a-104d. For example, contacts 214a-214h are shown in FIGS. 2A and 2B. The contacts 214a-214h include contact portions 106a-106g and contact portions 108a-108g, respectively.

Each of the contact portions 106a-106g may be disposed on one of the interconnects 102a-102d. For example, the contact portions 106a, 106c, and 106e may be disposed on the interconnect 102a. The contact portion 106g may be disposed on the interconnect 102b. The contact portions 106b, 106d, and 106f may be disposed on the interconnect 102c. The contact portion 106h may be disposed on the interconnect 102d.

As shown in the top view of FIG. 1, each of the contact portions 106a-106h has a cross section. The cross section of each of the contact portions 106a-106h has a length in the direction 112 and a width DL1 less than the length in the direction 114. In some embodiments, the cross section may have an oval shape. The cross section may have a long diameter DL1 in the direction 112 and a short diameter in the direction 114. In some embodiments, the short diameter is less than a sum of a width W1 of each of the interconnects 102a-102d and an interval Int1 between adjacent interconnects of the interconnects 102a-102d. In some embodiments, the short diameter of the cross section may be less than the width W1 of each of the interconnects 102a-102d. Thus, the adjacent interconnects of the interconnects 102a-102d may not be short-circuited from one another through the contact portions 106a-106h.

Each of the contact portions 108a-108g may be disposed on a corresponding contact portion of the contact portions 106a-106g. The interconnects 104a-104d may be disposed on one or more corresponding contact portions of the contact portions 108a-108g. For example, the interconnect 104a may be disposed on the contact portions 108a and 108b. The interconnect 104b may be disposed on the contact portions 108c and 108d. The interconnect 104c may be disposed on the contact portions 108e and 108f. The interconnect 104d may be disposed on the contact portions 108g and 108h.

As shown in the top view of FIG. 1, each of the contact portions 108a-108h has a cross section. The cross section of each of the contact portions 108a-108h has a length DL2 in the direction 114 and a width less than the length in the direction 112. In some embodiments, the cross section of each of the contact portions 108a-108h may have an oval shape. The cross section of each of the contact portions 108a-108h may have a long diameter DL2 in the direction 114 and a short diameter in the direction 112. In some embodiments, the short diameter is less than a sum of a width W2 of each of the interconnects 104a-104d and an interval Int2 between adjacent interconnects of the interconnects 104a-104d. In some embodiments, the short diameter of the cross section of each of the contact portions 108a-108h may be less than the width W2 of each of the interconnects 104a-104d. The adjacent contact portions, such as the contact portions 108a and 108c, 108c and 108e, 108b and 108d, 108d and 108f may be apart from each other. Thus, the adjacent interconnects of the interconnects 104a-104d may not be short-circuited from one another through the contact portions 108a-108h.

The contact portions 106a-106h and the contact portions 108a-108h may include conductive material. In some embodiments, the contact portions 106a-106h and the contact portions 108a-108h may include the same conductive material. In some embodiments, the conductive material may be tungsten. In some embodiments, the contact portions 106a-106h and the contact portions 108a-108h may include different conductive materials.

In some embodiment, the semiconductor device 100 may be a memory device (e.g., a dynamic random access memory (DRAM)) including memory cells 206 in FIG. 2A, for example.

The semiconductor device 100 may further include a memory array region 202. The memory array region 202 may include the memory cells 206. Each memory cell of the memory cells 206 may include a transistor (e.g., a transistor 212a or a transistor 212b) on the substrate 110. In some embodiments, the transistor (e.g., a transistor 212a or a transistor 212b) may be a metal-oxide-semiconductor field-effect transistor (MOSFET) in the DRAM, for example.

Each memory cell of the memory cells 206 may include a capacitor (e.g., the capacitor 210a or the capacitor 210b of FIG. 2A) on the corresponding transistor (e.g., the transistor 212a or the transistor 212b, respectively). Each capacitor (e.g., the capacitor 210a or the capacitor 210b) may store a value representing a binary data bit. In some embodiments, each capacitor (e.g., the capacitor 210a or the capacitor 210b) may have a pillar structure extending in a direction perpendicular to the substrate 110. Each capacitor (e.g., the capacitor 210a or the capacitor 210b) may include a lower capacitor electrode at one end of the pillar structure and an upper capacitor electrode at another end of the pillar structure. The lower capacitor electrode of each capacitor (e.g., the capacitor 210a or the capacitor 210b) may be coupled to the corresponding transistor (e.g., the transistor 212a or the transistor 212b, respectively).

The semiconductor device 100 may include a power supply line 208 that may provide a power supply voltage. The power supply line 208 may include conductive material, such as tungsten, for example. The power supply line 208 may include a portion in the memory array region 202 and another portion in the peripheral region 204. The portion of the power supply line 208 in the memory array region 202 is disposed above upper capacitor electrodes of the memory cells 206 and coupled to the upper capacitor electrodes of the memory cells 206. The other portion of the power supply line 208 in the peripheral region 204 is disposed under the interconnects 102a-102d. In some embodiments, the interconnects 102a-102d may be disposed on the other portion of the power supply line 208 in the peripheral region 204. The contact portions 106a-106h may be disposed on the interconnects 102a-102d. In some embodiments, a height of the portion of the power supply line 208 in the memory array region 202 and a height of the contact portions 106a-106h may be substantially the same.

The semiconductor device 100 may include a dielectric layer 216 above the portion of the power supply line 208 in the peripheral region 204. In some embodiments, a top surface of the dielectric layer may have the same height as the height of the portion of the power supply line 208 in the memory array region 202. The contact portions 106a-106h may be disposed in the dielectric layer 216. The semiconductor device 100 may include a dielectric layer 218. The dielectric layer 218 may be disposed across the memory array region 202 and the peripheral region 204. A portion of the dielectric layer 218 in the peripheral region 204 may be disposed on the dielectric layer 216 and the contact portions 106a-106h. A portion of the dielectric layer 218 in the memory array region 202 may be disposed on the portion of the power supply line 208 in the memory array region 202. In some embodiments, the contact portions 108a-108h may be disposed in the dielectric layer 218. In some embodiments, the dielectric layers 216 and 218 may include silicon oxide (SiO2).

The following describes methods of forming apparatuses, such as the semiconductor device 100 according to the embodiments with reference to FIG. 3A to FIG. 6B. The dimensions and the ratios of dimensions of each portion in each drawing do not necessarily coincide with the dimensions and the ratios of dimensions of the actual semiconductor device.

Figure 3A:
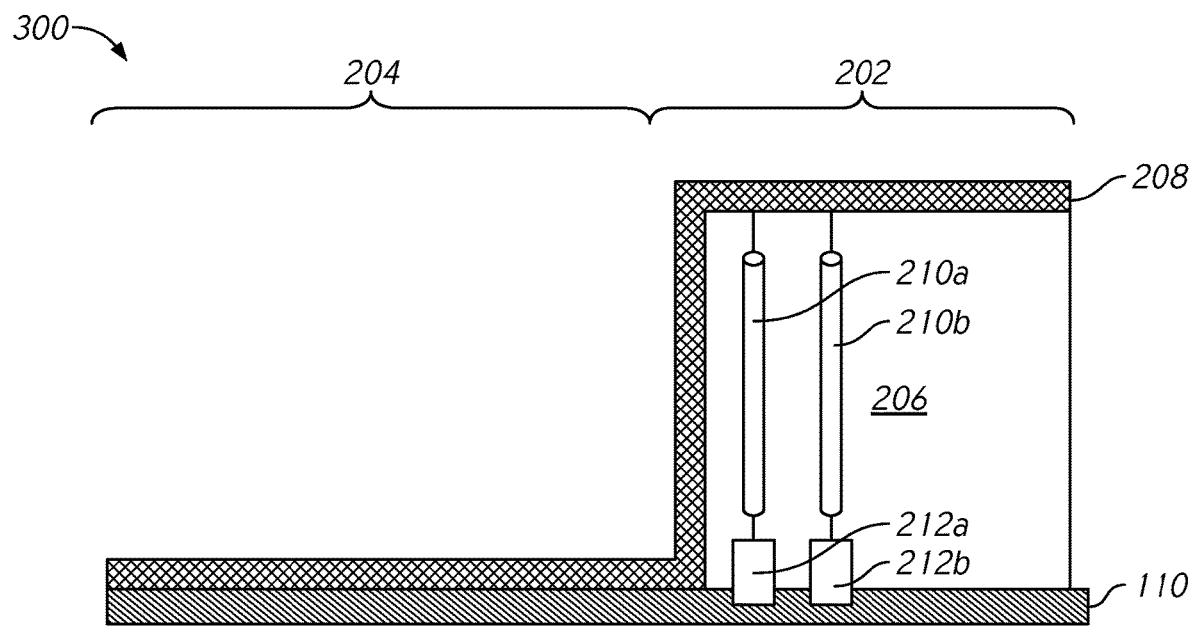
FIG. 3A is a diagram of a vertical cross-sectional view of a structure of a portion of a semiconductor device in accordance with an embodiment of the present disclosure.
Figure 3B:
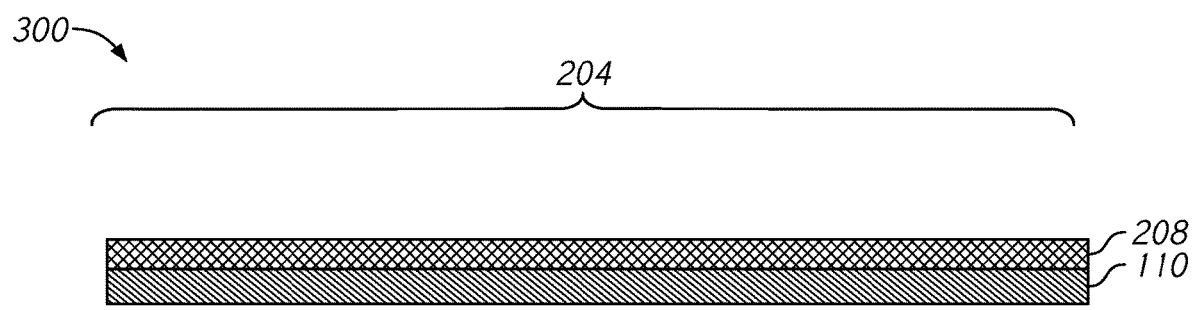
FIG. 3B is a diagram of another vertical cross-sectional view of the structure of the portion of the semiconductor device of FIG. 3A in accordance with the embodiment of the present disclosure.

FIG. 3A is a diagram of a vertical cross-sectional view of one schematic structure of a portion 300 of a semiconductor device 100 in accordance with an embodiment of the present disclosure. FIG. 3B is a diagram of another vertical cross-sectional view of the one schematic structure of the portion 300 of the semiconductor device 100 in accordance with the embodiment of the present disclosure. The vertical cross sectional view of the portion 300 in FIG. 3A is a view in the direction 114. The other vertical cross sectional view of the portion 300 in FIG. 3B is a view in the direction 112. In some embodiments, the portion 300 of the semiconductor device 100 may be an intermediate structure that is used to fabricate the portion 200 of FIGS. 2A and 2B.

The portion 300 in FIG. 3A includes the memory array region 202 and the peripheral region 204 of the semiconductor device 100. In some embodiments, the semiconductor device 100 may include the substrate 110 across the memory array region 202 and the peripheral region 204. In some embodiments, the substrate 110 may include a single-crystal silicon, for example.

In some embodiments, the portion 300 may include the memory cells 206 in the memory array region 202 of FIG. 3A. As described earlier with reference to FIG. 2A, each memory cell of the memory cells 206 may include a transistor (e.g., the transistor 212a or the transistor 212b of FIG. 2A) on the substrate 110 and a corresponding capacitor (e.g., the capacitor 210a or the capacitor 210b of FIG. 2A) on the transistor. In some embodiments, conductive material may be deposited in the memory array region 202 and the peripheral region 204. The conductive material may be, for example, tungsten. The conductive material may be deposited on the substrate 110 in the peripheral region 204 and above the capacitors, including the capacitors 210a and 210b, of the memory cells 206 in the memory array region 202. The power supply line 208 may be formed from the deposited conductive material.

In some embodiments, the conductive material may be deposited concurrently in the memory array region 202 and the peripheral region 204. Thus, the power supply line 208 may be formed on the substrate 110 in the peripheral region 204 and above the capacitors of the memory cells 206 in the memory array region 202 to be coupled to upper capacitor electrodes of the memory cells 206.

Figure 4A:
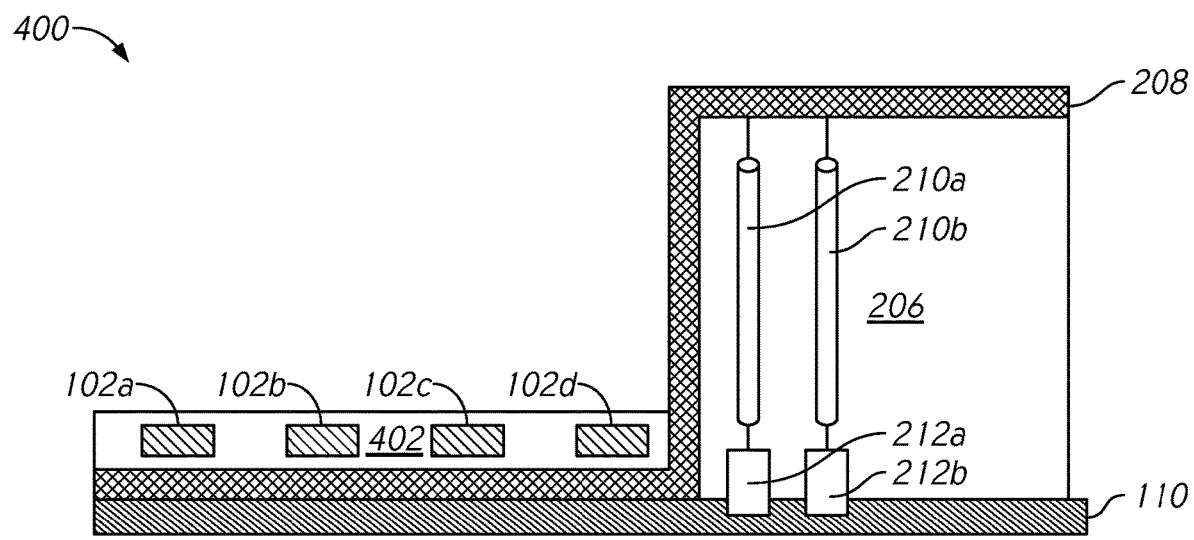
FIG. 4A is a diagram of a vertical cross-sectional view of a structure of a portion of a semiconductor device in accordance with an embodiment of the present disclosure.
Figure 4B:
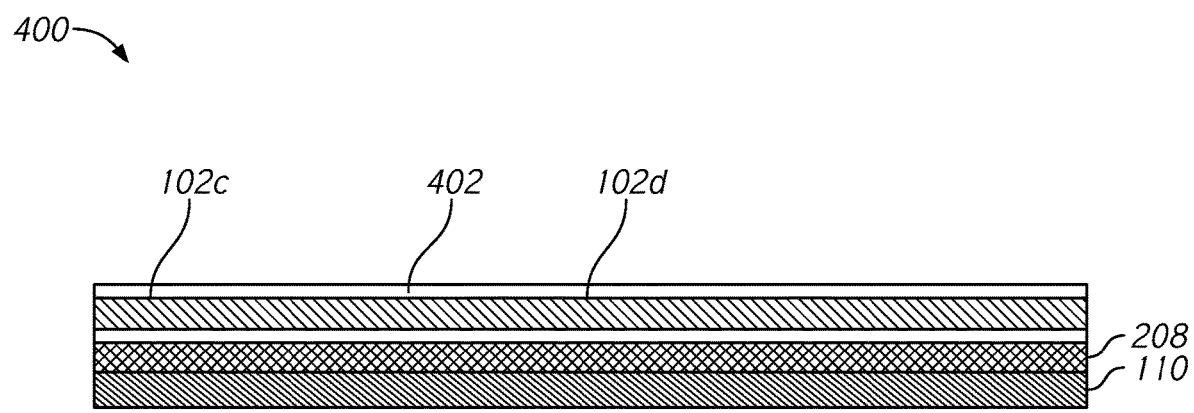
FIG. 4B is a diagram of another vertical cross-sectional view of the structure of the portion of the semiconductor device of FIG. 4A in accordance with the embodiment of the present disclosure.

FIG. 4A is a diagram of a vertical cross-sectional view of one schematic structure of a portion 400 of a semiconductor device 100 in accordance with an embodiment of the present disclosure. FIG. 4B is a diagram of another vertical cross-sectional view of the one schematic structure of the portion 400 of the semiconductor device 100 in accordance with the embodiment of the present disclosure. The vertical cross sectional view of the portion 400 in FIG. 4A is a view in the direction 114. The other vertical cross sectional view of the portion 400 in FIG. 4B is a view in the direction 112. In some embodiments, the portion 400 of the semiconductor device 100 may be an intermediate structure that is used to fabricate the portion 200 of FIGS. 2A and 2B.

The portion 400 includes the memory array region 202 and the peripheral region 204 of the semiconductor device 100. A dielectric layer 402 may be disposed on the power supply line 208 in the peripheral region 204. In some embodiments, the dielectric layer 402 may include dielectric material. The dielectric material may include, for example, silicon oxide (SiO2). The dielectric material may be deposited by physical vapor deposition (PVD) or chemical vapor deposition (CVD). In some embodiments, the interconnects 102a-102d may be formed in the dielectric layer 402 in the peripheral region 204. In some embodiments, the conductive material may be deposited and excessive portions of the conductive material around the interconnects 102a-102d may be removed. Then dielectric material may be deposited to form the dielectric layer 402. The dielectric layer 402 may cover the interconnects 102a-102d, and a top portion of the dielectric layer 402 may be removed to expose top surfaces of the interconnects 102a-102d. In other embodiments, the dielectric layer 402 may be formed and openings may be provided in the dielectric layer 402 to form the interconnects 102a-102d in the openings. Thus, in some embodiments, the interconnects 102a-102d may be disposed above the power supply line 208 in the peripheral region 204.

The conductive material may be deposited by physical vapor deposition (PVD) or chemical vapor deposition (CVD). The conductive material may be, for example, copper or aluminum. As shown in FIG. 4A, adjacent interconnects of the interconnects 102a-102d may be spaced apart from one another with an interval. The interconnects 102a-102d may be insulated from one another by the dielectric layer 402. As shown in FIG. 4B, the interconnects 102a-102d may extend over the power supply line 208 in the peripheral region 204 that may extend in the direction 112.

Figure 5A:
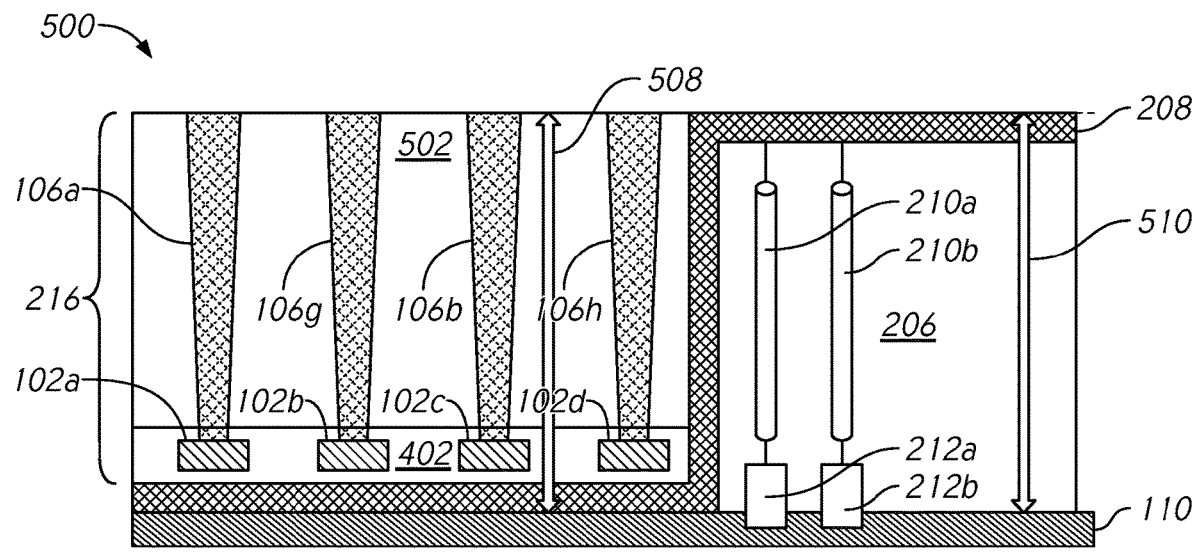
FIG. 5A is a diagram of a vertical cross-sectional view of a structure of a portion of a semiconductor device in accordance with an embodiment of the present disclosure.
Figure 5B:
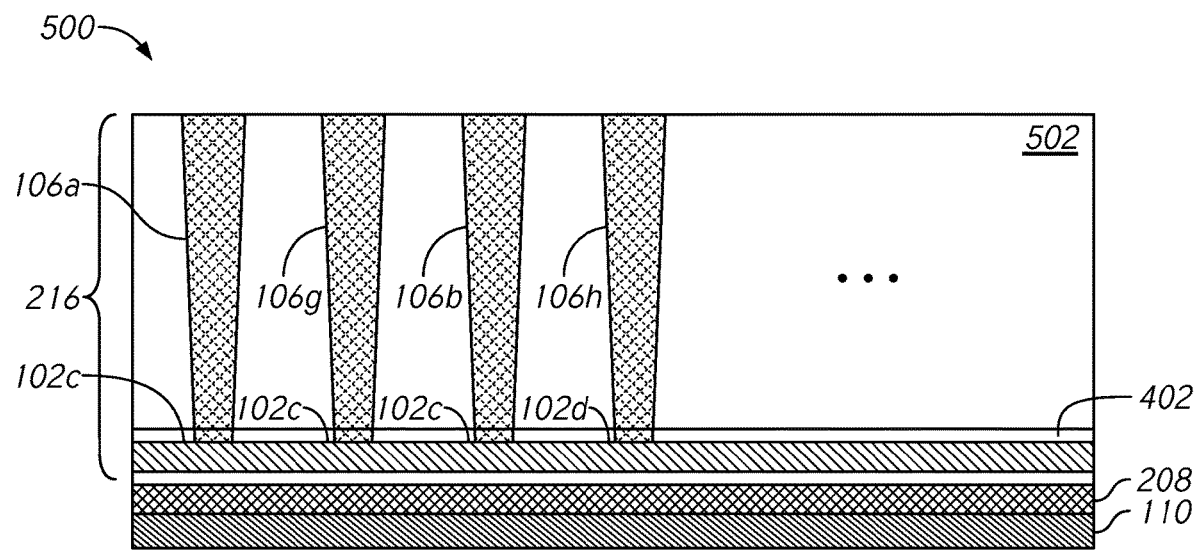
FIG. 5B is a diagram of another vertical cross-sectional view of the structure of the portion of the semiconductor device of FIG. 5A in accordance with the embodiment of the present disclosure.

FIG. 5A is a diagram of a vertical cross-sectional view of one schematic structure of a portion 500 of a semiconductor device 100 in accordance with an embodiment of the present disclosure. FIG. 5B is a diagram of another vertical cross-sectional view of the one schematic structure of the portion 500 of the semiconductor device 100 in accordance with the embodiment of the present disclosure. The vertical cross sectional view of the portion 500 in FIG. 5A is a view in the direction 114. The other vertical cross sectional view of the portion 500 in FIG. 5B is a view in the direction 112. In some embodiments, the portion 500 of the semiconductor device 100 may be an intermediate structure that is used to fabricate the portion 200 of FIGS. 2A and 2B.

One or more dielectric layers 502 may be formed above the interconnects 102a-102d and the dielectric layers 402. In some embodiments, the dielectric layer 216 of FIGS. 2A and 2B may include the dielectric layer 402 and the one or more dielectric layers 502. In some embodiments, the one or more dielectric layers 502 may include dielectric material. The dielectric material may include, for example, silicon oxide (SiO2). The dielectric material may be deposited by physical vapor deposition (PVD) or chemical vapor deposition (CVD). In some embodiments, a height 508 of a top surface of the one or more dielectric layers 502 from the substrate 110 and a height 510 of the power supply line 208 from the substrate 110 in the memory array region 202 may be substantially the same.

Figure 5C:
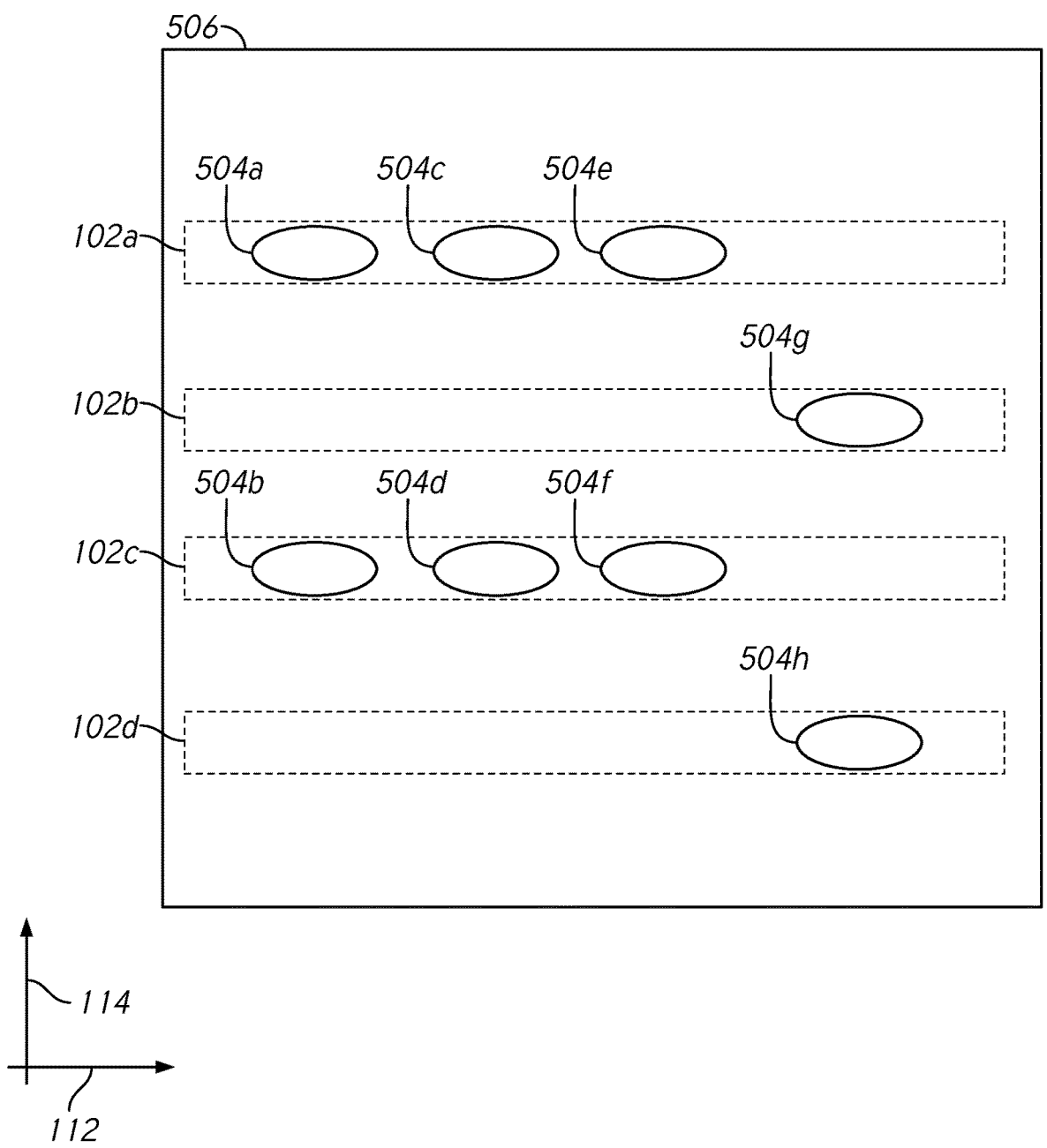
FIG. 5C is a diagram of a pattern in accordance with an embodiment of the present disclosure.

Portions of the one or more dielectric layers 502 may be removed to form openings. In some embodiments, removing the portions of the one or more dielectric layers 502 may be performed by photopatterning a mask and dry-etching a pattern in the mask to form the openings. FIG. 5C is a schematic diagram of a mask 506 in accordance with an embodiment of the present disclosure. In some embodiments, the mask 506 may be disposed above the dielectric layer 502. For example, using lithography, the mask 506 may be disposed including a pattern of holes 504a-504h. The holes 504a-504h may correspond to cross sections of the contact portions 106a-106h. In some embodiments, the holes 504a-504h may be in an oval shape. In some embodiments, each of the holes 504a-04h may have a long diameter in the direction 112. The holes 504a, 504c and 504e may be disposed above the interconnect 102a. The holes 504g may be disposed above the interconnect 102b. The holes 504b, 504d and 504f may be disposed above the interconnect 102c. The hole 504h may be disposed above the interconnect 102d.

Dry-etching through the holes 504a to 504h may be performed to remove the portions of the one or more dielectric layers 502. The portions of one or more dielectric layers 502 under the holes 504a-504h not covered by the mask 506 may be exposed for etching. In some embodiments, dry etching may be performed until the etching is stopped by the interconnects 102a-102d. Thus, the portions of one or more dielectric layers 502 under the holes 504a-504h may be removed and the openings may be formed. The openings may expose the interconnects 102a-102d at bottoms of the openings. In post-etching process (e.g., dry ashing and wet cleansing), the mask 506 may be removed.

In some embodiments, conductive material may be deposited on the one or more dielectric layers 502 in the openings to form the contact portions 106a-106h in the openings. Forming the contact portions 106a-106h in the holes 504a-504h result in the contact portions 106a-106h having an oval shape with a long diameter DL1 in the direction 112 as shown in FIG. 2B. The conductive material may be, for example, tungsten. The conductive material may be deposited by physical vapor deposition (PVD) or chemical vapor deposition (CVD). The contact portions 106a-106h may be disposed on the interconnects 102a-102d. In some embodiments, a height 510 of the portion of the power supply line 208 in the memory array region 202 and a height 508 of the contact portions 106a-106h may be substantially the same.

Figure 6A:
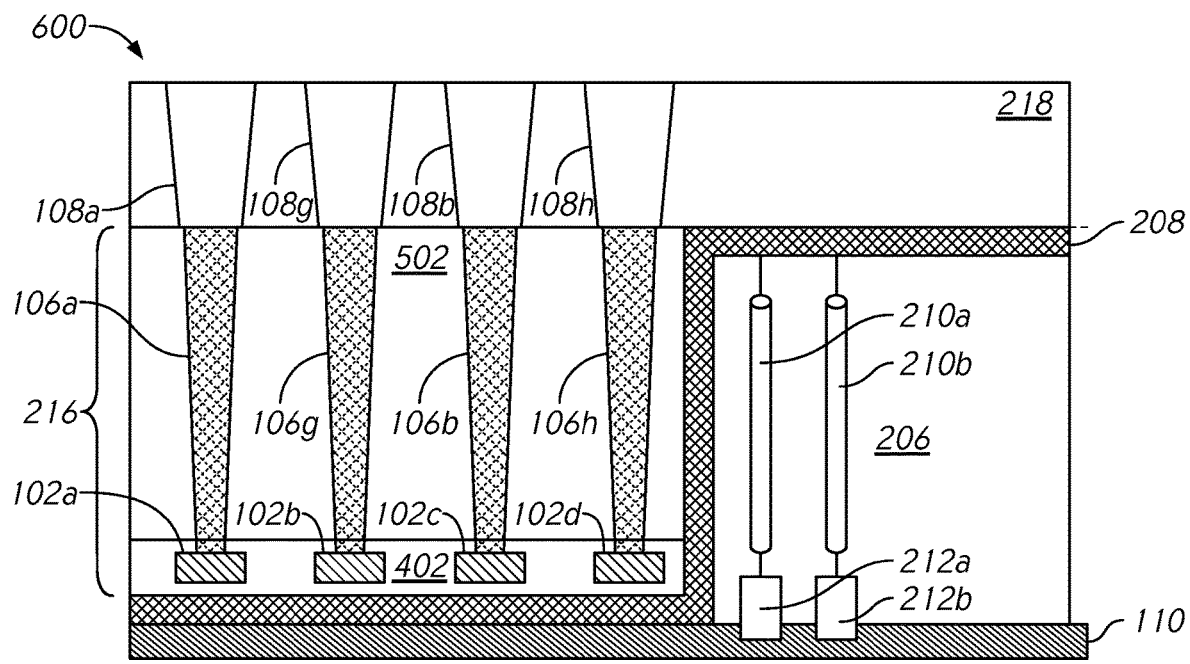
FIG. 6A is a diagram of a vertical cross-sectional view of a structure of a portion of a semiconductor device in accordance with an embodiment of the present disclosure.
Figure 6B:
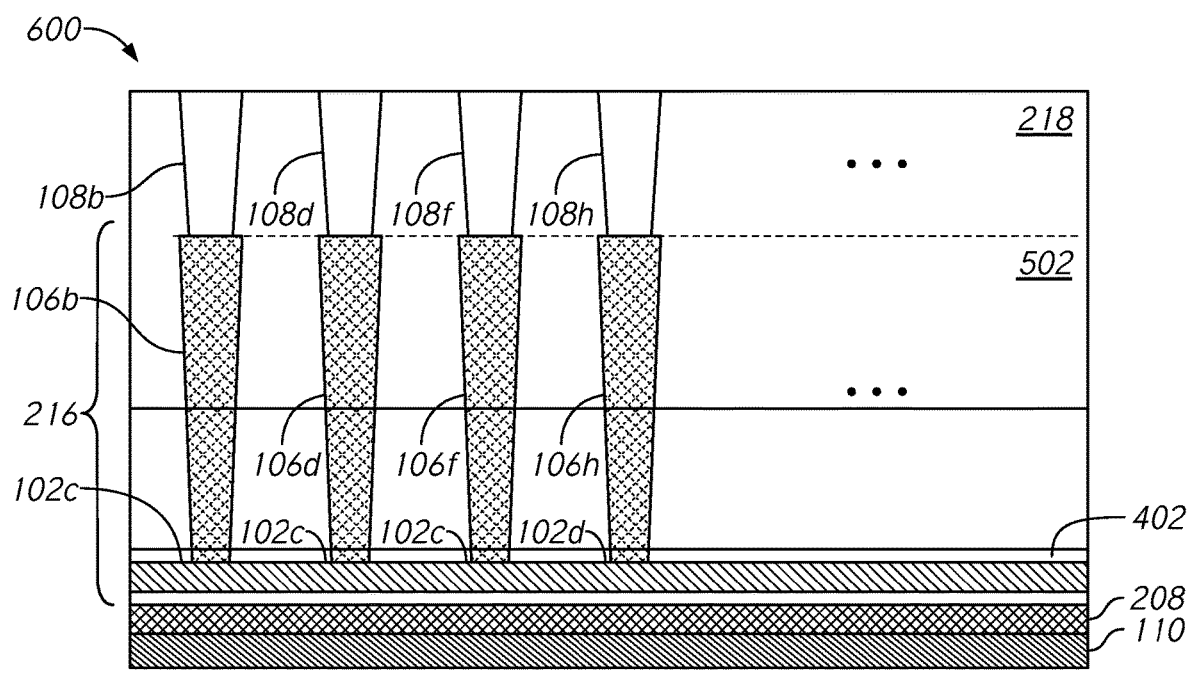
FIG. 6B is a diagram of another vertical cross-sectional view of the structure of the portion of the semiconductor device of FIG. 6A in accordance with the embodiment of the present disclosure.

FIG. 6A is a diagram of a vertical cross-sectional view of one schematic structure of a portion 600 of a semiconductor device 100 in accordance with an embodiment of the present disclosure. FIG. 6B is a diagram of another vertical cross-sectional view of the one schematic structure of the portion 600 of the semiconductor device 100 in accordance with the embodiment of the present disclosure. The vertical cross sectional view of the portion 600 in FIG. 6A is a view in the direction 114. The other vertical cross sectional view of the portion 600 in FIG. 6B is a view in the direction 112. In some embodiments, the portion 600 of the semiconductor device 100 may be an intermediate structure that is used to fabricate the portion 200 of FIGS. 2A and 2B.

One or more dielectric layers 218 may be formed above the contact portions 106a-106h and the one or more dielectric layers 502 in the peripheral region 204, and on the power supply line 208 in the memory array region 202. In some embodiments, the dielectric layer 218 may include dielectric material. The dielectric material may include, for example, silicon oxide (SiO2). The dielectric material may be deposited by physical vapor deposition (PVD) or chemical vapor deposition (CVD).

Figure 6C:
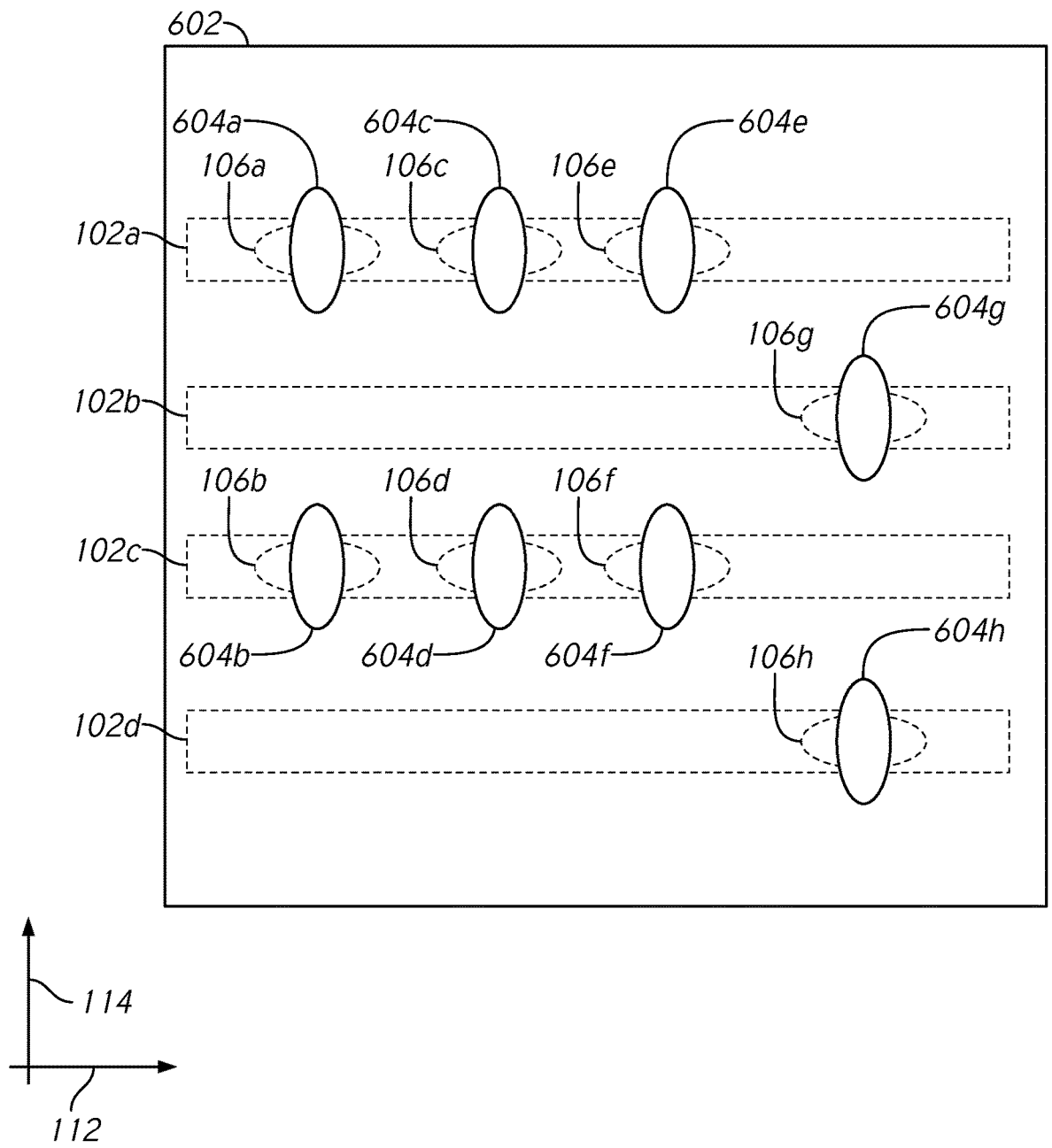
FIG. 6C is a schematic diagram of a mask in accordance with an embodiment of the present disclosure.

Portions of the one or more dielectric layers 218 may be removed to form openings. In some embodiments, removing the portions of the one or more dielectric layers 218 may be performed by photopatterning a mask and dry-etching a pattern in the mask to form the openings. FIG. 6C is a schematic diagram of a mask 602 in accordance with an embodiment of the present disclosure. In some embodiments, the mask 602 may be disposed above the dielectric layer 218. For example, using a lithography, the mask 602 may be disposed including a pattern of holes 604a-604h. The holes 604a-604h may correspond to cross sections of the contact portions 108a-108h. In some embodiments, the holes 604a-604h may be in an oval shape. In some embodiments, each of the holes 604a-604h may have a long diameter in the direction 114. The holes 604a, 604c and 604e may be disposed above the interconnect 102a. The holes 604g may be disposed above the interconnect 102b. The holes 604b, 604d and 604f may be disposed above the interconnect 102c. The hole 604h may be disposed above the interconnect 102d.

Dry-etching through the holes 604a-604h may be performed to remove the portions of the one or more dielectric layers 218. The portions of one or more dielectric layers 218 under the holes 604a-604h not covered by the mask 602 may be exposed for etching. In some embodiments, dry etching may be performed until the etching is stopped by the contacts. Thus, the portions of one or more dielectric layers 502 under the holes 504a-504h may be removed and the openings may be formed. The openings may expose the contact portions 106a-106h at bottoms of the openings. In post-etching process (e.g., dry ashing and wet cleansing), the mask 602 may be removed.

In some embodiments, conductive material may be deposited on the one or more dielectric layers 502 to form contact portions 108a-108h in the openings. Forming the contact portions 108a-108h in the holes 604a-604h result in the contact portions 108a-108h having an oval shape with a long diameter DL2 in the direction 114 as shown in FIG. 2A. The conductive material may be, for example, tungsten. The conductive material may be deposited by physical vapor deposition (PVD) or chemical vapor deposition (CVD).

Interconnects 104a-104d in FIG. 1 may be disposed on the one or more dielectric layers 218 and the contact portions 108a-108h in the one or more dielectric layers 218. The interconnects 104a-104d may extend in the direction 114. Forming the interconnects 104a-104d may be similar to forming the interconnects 102a-102d in the dielectric layer 402 previously described with reference to and shown in FIGS. 4A and 4B, thus the description of forming the interconnects 104a-104d is omitted for brevity. As shown in FIG. 1, the interconnect 104a may be disposed on the contact portions 108a and 108b, the interconnect 104b may be disposed on the contact portions 108c and 108d, the interconnect 104c may be disposed on the contact portions 108e and 108f, and the interconnect 104d may be disposed on the contact portions 108g and 108h.

In the description above, contacts are formed in two steps; however, a number of steps to form contacts are not limited to two. Forming contacts (e.g., vias) in a peripheral region in a plurality of etching steps, instead of one etching step, openings would have a smaller cross-section unlike contacts formed using one etching step. Each contact may have an oval-shape cross section having a long diameter in a direction that each interconnect coupled to each contact extends. Thus, a short circuit between adjacent interconnects may be prevented.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
   a plurality of first interconnects extending in a first direction;
   a plurality of second interconnects above the plurality of first interconnects, the plurality of second interconnects extending in a second direction different from the first direction;
   a plurality of contacts, wherein each contact of the plurality of contacts comprises:
   a first portion coupled to a corresponding first interconnect of the plurality of first interconnects; and
   a second portion on the first portion, the second portion coupled to a corresponding second interconnect of the plurality of second interconnects,
   wherein the first portion has a first cross section including:
   a first length in the first direction; and
   a first width that is perpendicular to the first length and less than the first length, and
   wherein the second portion has a second cross section including:
   a second length in the second direction; and
   a second width perpendicular to the second length and less than the second length.

2. The apparatus of claim 1, wherein the first direction and the second direction are perpendicular to each other when viewed from above the apparatus.

3. The apparatus of claim 1, wherein the first cross section has an oval shape with a long diameter in the first direction.

4. The apparatus of claim 3, wherein the first cross section has a short diameter that is smaller than a sum of a width of each first interconnect and an interval between adjacent first interconnects of the plurality of first interconnects.

5. The apparatus of claim 1, wherein the second cross section has an oval shape with a long diameter in the second direction.

6. The apparatus of claim 5, wherein the second cross section has a short diameter that is smaller than a sum of a width of each second interconnect and an interval between adjacent second interconnects of the plurality of second interconnects.

7. The apparatus of claim 1, wherein the one or more first interconnects, the one or more second interconnects, and the one or more contacts include one or more conductive materials.

8. The apparatus of claim 7, wherein the one or more contacts comprises tungsten.

9. The apparatus of claim 7, wherein the first interconnect and the second interconnect comprise at least one of copper or aluminum.

10. The apparatus of claim 1, further comprising:
    a memory array region comprising a plurality of memory cells; and
    a peripheral region,
    wherein the plurality of contacts are disposed in the peripheral region.

11. The apparatus of claim 10, wherein each memory cell of the plurality of memory cells further comprises:
    a transistor on a substrate;
    a capacitor on the transistor including:
    a lower capacitor electrode coupled to the transistor; and
    an upper capacitor electrode; and
    a power supply line coupled to the upper capacitor electrode;
    wherein a height of the first portion from the substrate and a height of a portion of the power supply line from the substrate in the memory array region are substantially the same.

12. The apparatus of claim 11, wherein the portion of the power supply line is a first portion,
    wherein the power supply line includes a second portion in the peripheral region under the plurality of first interconnects.

13. An apparatus comprising:
    a first interconnect extending in a first direction;
    a second interconnect above the first interconnect, the second interconnect extending in a second direction different from the first direction; and
    a contact coupled between the first interconnect and the second interconnect, wherein the contact comprises:
    a first portion on the first interconnect, wherein a cross section of the first portion has an oval shape having a long diameter in the first direction; and
    a second portion between the first portion and the second interconnect, wherein a cross section of the second portion has an oval shape having a long diameter in the second direction.

14. The apparatus of claim 13, further comprising:
    a substrate;
    a memory region and a peripheral region;
    a plurality of capacitors of a plurality of memory cells disposed in the memory array region and above the substrate; and
    a power supply line extending above the plurality of capacitors in the memory array region and further extending above the substrate and under the plurality of first interconnects in the peripheral region.

15. The apparatus of claim 14, wherein the cross section of the first portion has a short diameter in the second direction that is smaller than a sum of a width of each first interconnect and a first interval between the first interconnect and another first interconnect adjacent to the first interconnect, and
    wherein the cross section of the second portion has a short diameter that is smaller than a sum of a width of the second interconnect and a second interval between the second interconnect and another second interconnect adjacent to the second interconnect.

* * * * *